United States Patent

Wilt

(10) Patent No.: US 8,974,899 B1
(45) Date of Patent: Mar. 10, 2015

(54) PSEUDOMORPHIC GLASS FOR SPACE SOLAR CELLS

(75) Inventor: David M. Wilt, Albuquerque, NM (US)

(73) Assignee: The United States of America as Represented by the Secretary of the Air Force, Washington, DC (US)

(*) Notice: Subject to any disclaimer, the term of this patent is extended or adjusted under 35 U.S.C. 154(b) by 522 days.

(21) Appl. No.: 13/114,119

(22) Filed: May 24, 2011

(51) Int. Cl.
| | |
|---|---|
| *H01L 31/0216* | (2014.01) |
| *H01L 31/042* | (2014.01) |
| *C03C 14/00* | (2006.01) |
| *B82Y 30/00* | (2011.01) |
| *B32B 5/16* | (2006.01) |
| *B32B 27/06* | (2006.01) |

(52) U.S. Cl.
CPC .. *B32B 5/16* (2013.01); *B32B 27/06* (2013.01)
USPC .................. 428/323; 136/244; 136/256; 3/32

(58) Field of Classification Search
CPC .............................. G21F 1/06; H01L 31/0413
USPC .......................................................... 428/343
See application file for complete search history.

(56) References Cited

U.S. PATENT DOCUMENTS

| | | | | |
|---|---|---|---|---|
| 4,866,108 | A | * | 9/1989 | Vachon et al. ................. 523/428 |
| 4,909,856 | A | * | 3/1990 | Ralph ........................... 136/256 |
| 5,008,049 | A | * | 4/1991 | Rose et al. ........................ 264/4 |
| 2008/0251757 | A1 | * | 10/2008 | Yamamoto et al. ............. 252/73 |

* cited by examiner

*Primary Examiner* — Callie Shosho
*Assistant Examiner* — Cheng Huang
(74) *Attorney, Agent, or Firm* — James M. Skorich

(57) ABSTRACT

A flexible hybrid coverglass for spacecraft solar panels comprised of small beads of either fused silica or ceria-doped borosilicate glass embedded in a matrix of conventional coverglass adhesives. These beads may also be used in a matrix of Kapton as the solar panel's substrate which may be combined with flexible solar cells to form flexible solar panels.

8 Claims, 9 Drawing Sheets

Flexible Solar Panel Cross-section with
PseudoMorphic Glass Coverglass and Substrate Flexible Solar Panel Cross-section with
PseudoMorphic Glass Coverglass and Substrate Convention Solar Panel Cross-section with
PseudoMorphic Glass Coverglass and Rigid Substrate Optical Micrograph of a PseudoMorphic Glass
Comprised of 20-40 Micron Diameter Ceria-doped
Borosilicate Beads in an Adhesive Optical Micrograph of a PseudoMorphic
Glass Comprised of 20-40 Micron Diameter
Fused Silica Beads in an Adhesive 12" x 12" 5-mil Thick Fused Silica PseudoMorphic Glass Table 1 – PMG Coverglass Candidate Materials

| Glass Spheres | Adhesive |
|---|---|
| Ceria-doped Borosilicate (20um – 40um dia) | Dow Corning DC93-500 |
| Fused Silica (20um – 40um dia) | NuSil SCV-2590 |
| | NuSil SCV1-2590 |
| | NuSil SCV2-2590 |

Current-Voltage Characteristics of ITJ Solar Cells
Covered with Ceria-doped Borosilicate PseudoMorphic Glass

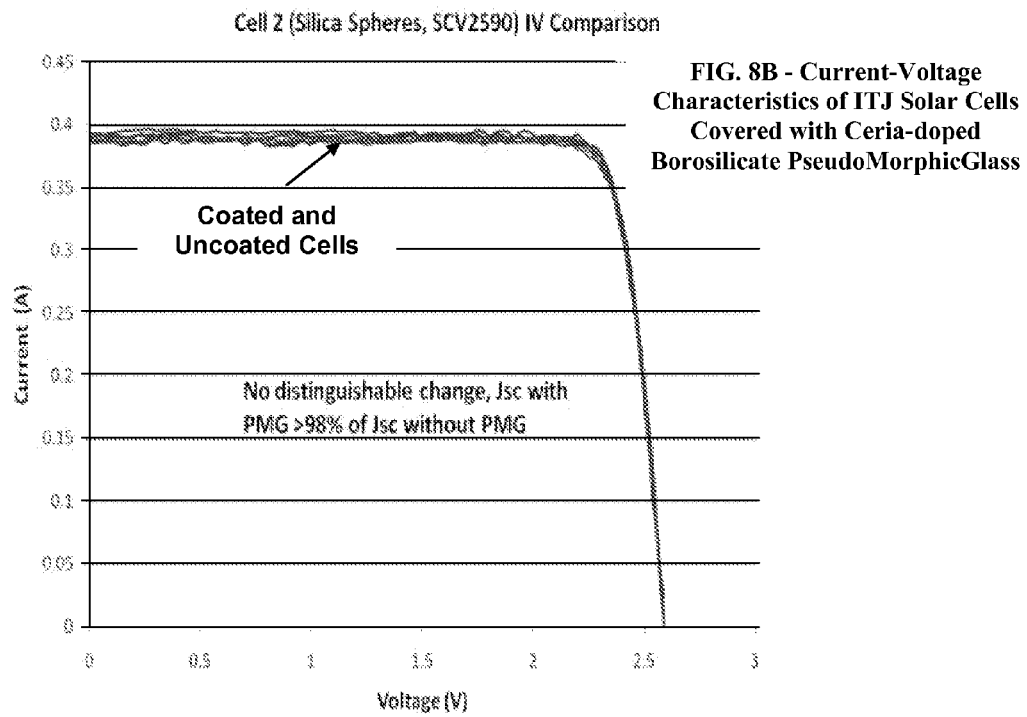
FIG. 8B - Current-Voltage Characteristics of ITJ Solar Cells Covered with Ceria-doped Borosilicate PseudoMorphicGlass
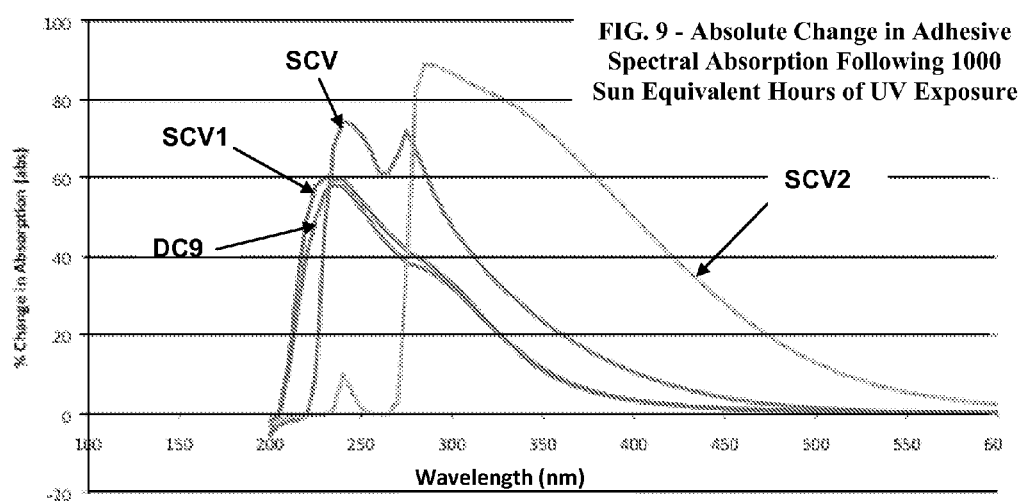
FIG. 9 - Absolute Change in Adhesive Spectral Absorption Following 1000 Sun Equivalent Hours of UV Exposure Absolute Change in Fused Silica PMG Spectral Absorption Following 1000 Sun-equivalent Hours of UV Exposure.

Absolute Change in Ceria-Doped Borosilicate glass PMG Spectral Absorption Following 1000 Sun-equivalent Hours of UV Exposure.

|  | FS PMG | CDB PMG | Coverglass | Bare |
|---|---|---|---|---|
| Voc | 86.2 | 87.0 | 86.1 | 89.8 |
| Jsc | 76.4 | 67.7 | 77.6 | 46.0 |
| FF | 102.9 | 106.3 | 100.7 | 87.8 |
| Efficiency (%) | 67.8 | 62.7 | 67.3 | 36.3 |

FIG. 12

| | FS PMG | | CDB PMG | | Coverglass | | Bare | |
|---|---|---|---|---|---|---|---|---|
| Fluence | 4E+14 | 4E+15 | 4E+14 | 4E+15 | 4E+14 | 4E+15 | 4E+14 | 4E+15 |
| Voc | 100.8 | 100.9 | 101.0 | 100.9 | 101.0 | 100.9 | 85.7 | 16.0 |
| Jsc | 99.1 | 94.3 | 99.1 | 94.5 | 99.8 | 99.0 | 20.4 | 0.1 |
| FF | 100.3 | 100.6 | 100.2 | 100.1 | 99.4 | 99.9 | 96.2 | 35.6 |
| Efficiency (%) | 100.2 | 95.6 | 100.4 | 95.5 | 100.2 | 99.8 | 16.8 | 0.0 |

FIG. 13

PSEUDOMORPHIC GLASS FOR SPACE SOLAR CELLS

STATEMENT OF GOVERNMENT INTEREST

The conditions under which this invention was made are such as to entitle the Government of the United States under paragraph 1(a) of Executive Order 10096, as represented by the Secretary of the Air Force, to the entire right, title and interest therein, including foreign rights.

BACKGROUND OF THE INVENTION

The invention relates generally to coverglass materials for spacecraft solar arrays and, in particular to a new coverglass material that provides high UV spectral transmissivity in a robust, flexible, and fully encapsulating format.

Traditional space solar arrays generally consist of solar cells bonded to rigid panel substrates and covered with ceria-doped borosilicate microsheets of glass. The rigid panels below and glass sheet above provide protection for the sensitive photovoltaic cells from the ultraviolet light, atomic oxygen and radiation e.g., protons and electrons, present in the space environment. Although coverglass materials have worked satisfactorily for existing solar cell technologies, their cost, fragility, and lack of complete encapsulation (the metal cell to cell interconnects are not covered by the coverglass) have led many organizations to search for a simpler alternative. In addition, space solar cell developers have indicated that advanced solar cells will require access to a wider spectral range than current coverglass materials provide. These efforts have primarily focused on either silicones or polyimide materials which could be applied in a variety of methods. To date, none have been developed which have the needed spectral transmissivity and environmental stability for the space environment.

A new solar cell design, called inverted metamorphic multijunction (IMM), has been recently developed that offers higher efficiency, plus the potential for significantly lower mass and flexibility. For an IMM cell, 10-15 microns of active semiconductor photovoltaic material are removed from the growth substrate resulting in an extremely efficient solar cell (>32% AM0) which is very light and incredibly fragile. Incorporating this new device into the standard rigid panel substrate and coverglass design negates the mass and flexibility opportunities available with the IMM. Thus, there is an even greater need to find coverglass replacement materials suitable for developing a low mass, environmentally stable, and flexible solar array blanket.

For thin, flexible blankets, environmental protection is required on both sides of the photovoltaic cell in order to shield it from the space environment. Kapton, a polyimide film developed by DuPont, is generally viewed as a reasonable option for a flexible substrate, as it has been used previously and is compatible with the space environment. In order to obtain sufficient thickness for radiation protection, about 8 mils of Kapton would be required to equal the shielding protection of 5 mils of coverglass. Kapton has a coefficient of thermal expansion which is roughly ten times greater than that of the IMM device. Thick Kapton films, such as this, may cause the fragile IMM device to fail under the extreme thermal cycling expected on orbit (<−100° C. to >+100° C.) due to the differences in the coefficient of thermal expansion.

Thus there is a need for a protective, flexible, environmentally stable coverglass replacement for both conventional solar arrays as well as for flexible solar arrays, a coverglass material that can be used with recently developed IMM cells to provide a tremendous increase in mass specific power and volumetric power density.

SUMMARY

Pseudomorphic Glass (PMG) consists of spheres-like beads of coverglass material, typically fused silica or ceria-doped borosilicate glasses of 20-40 microns diameter, embedded in a matrix of conventional coverglass adhesives. In this hybrid configuration, the matrix provides the mechanical integrity and the glass spheres provide the optical characteristics. PMG may replace convention coverglass for rigid solar panels or the beads may be combined with Kapton to protect the underside of the solar panels thus forming a flexible solar panel. PMG can be manufactured as microsheets that adhere to the solar cells or may be sprayed onto the cells. PMG has a greater transmission bandwidth than conventional coverglass materials required for new solar cell designs. The thickness of the PMG coating can be readily tailored to the shielding requirements of a particular mission. A multi-layer hybrid PMG coverglass using a thin top layer of ceria-doped borosilicate beads and a bottom layer of fused silica beads yields enhanced UV protection and a broadened spectral transmission bandwidth.

BRIEF DESCRIPTION OF THE DRAWINGS

FIG. 8B shows current-voltage plots of various ITJ solar cells coated with fused silica PMG compared to uncoated solar cells.

FIG. 9 plots the absolute change in adhesive spectral absorption following 1000 sun equivalent hours of UV exposure for four adhesives.

FIG. 12 is a table of the remaining factor for PMG, conventional coverglass coated and bare GaAs solar cells subjected to $2\times10^{15}/cm^2$ 1-MeV electron irradiation.

FIG. 13 is a table of the remaining factor for GaAs solar cells covered with fused silica PMG, ceria-doped borosilicate glass PMG, conventional coverglass, and bare subjected to either $4\times10^{14}/m^2$ or $4\times10^{15}/cm^2$ 50-keV protons.

DESCRIPTION OF THE PREFERRED EMBODIMENT

Figure 1:
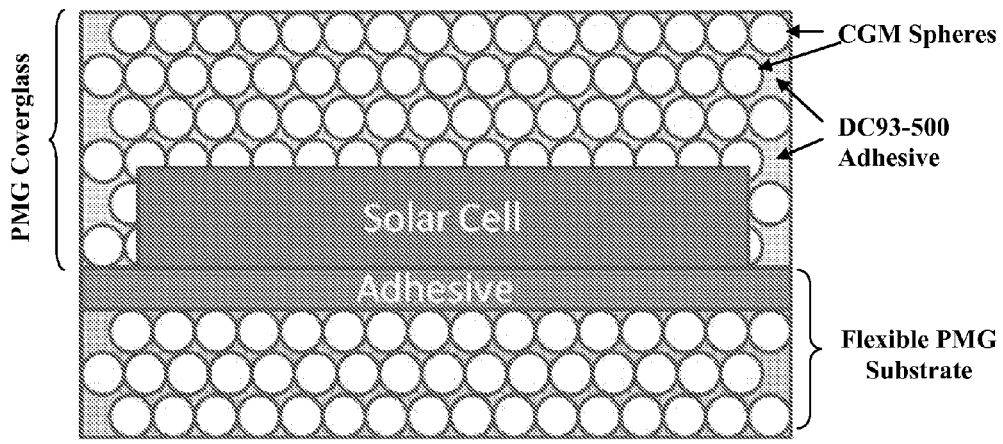
FIG. 1 is a cross-section of a flexible solar panel incorporating pseudomorphic glass for the coverglass and substrate.
Figure 2:
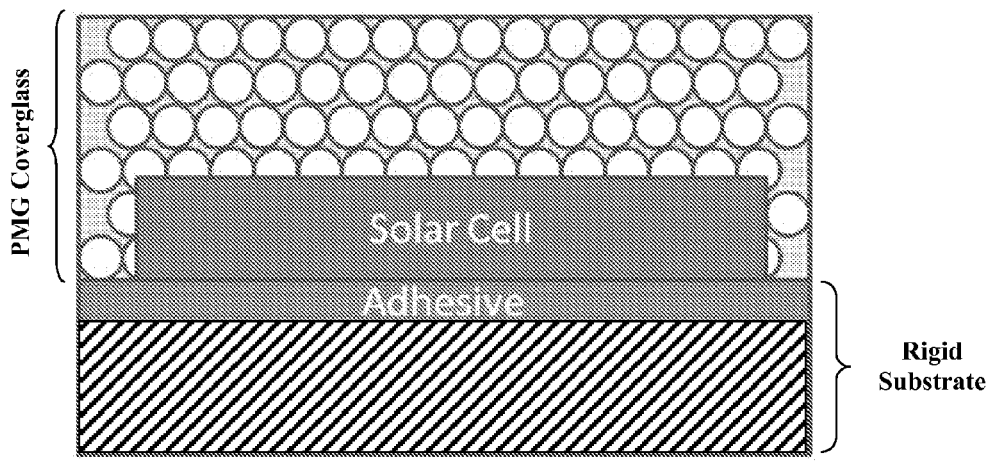
FIG. 2 is a cross-section of a conventional solar panel incorporating pseudomorphic glass for the coverglass and having a rigid substrate.

PseudoMorphic Glass (PMG) uses conventional solar array materials (coverglasses and adhesives) but in a novel hybrid format that leverages the favorable properties of each. PMG consists of small diameter spheres of traditional coverglass materials, such as ceria-doped borosilicate glass and/or fused silica, imbedded in a matrix of either coverglass adhesives, such as DC93-500, a clear silicon adhesive by Dow Corning, or substrate replacement materials, such as Kapton. In this hybrid configuration, the matrix provides the mechanical integrity, and the glass spheres provide the primary radiation shielding. FIG. 1 shows a cross-section of a flexible solar panel blanket design incorporating PMG coverglass on the top as well as PMG for the substrate. In addition, PMG could be incorporated in conventional rigid panel designs, as shown in FIG. 2, wherein the PMG replaces the conventional coverglass.

Figure 3B:
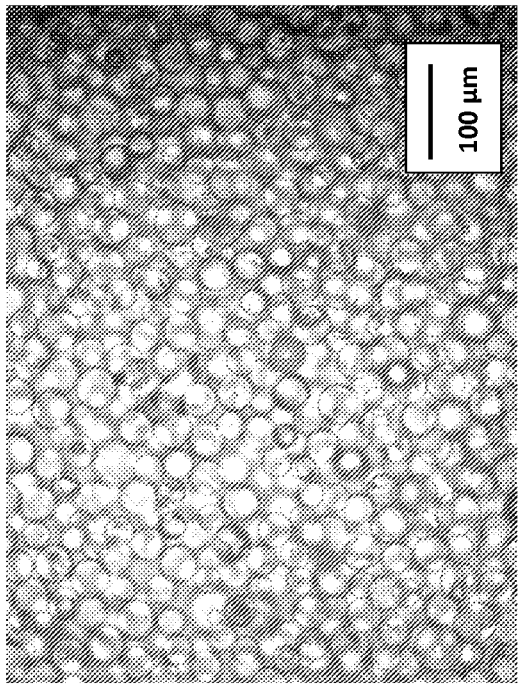
FIG. 3B is an optical micrograph of a PMG comprised of 20-40 micron diameter ceria-doped borosilicate beads in an adhesive.
Figure 3A:
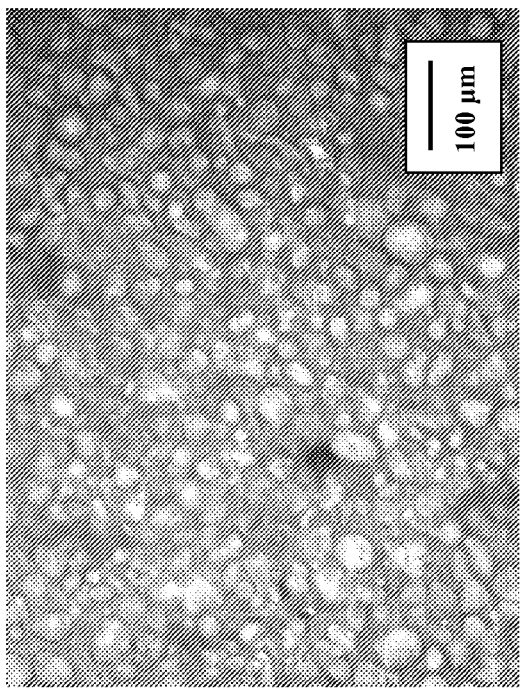
FIG. 3A is an optical micrograph of a PMG comprised of 20-40 micron diameter fused silica beads in an adhesive.

FIG. 3A shows an optical micrograph of a PMG with 20-40 micron diameter fused silica beads and FIG. 3B with ceria-doped borosilicate beads. The glass beads are commercially produced in a process whereby bulk samples of the target material are ground into small shards. These shards are then dropped through a furnace where they melt, form into spheres due to surface tension effects and cool as they fall, before being collected and sorted for size. As borosilicate glass material has a lower melting temperature than fused silica, it forms a more regular spherical shape as manufactured.

Figures 4, 5:
FIG. 4 shows a 12"×12" 5 mil thick fused silica PMG film.
FIG. 5 is a table of PMG coverglass candidate material and adhesive combinations.

FIG. 4 shows a 12"×12" 5 mil thick fused silica PMG film formed using a doctor blade process. The PMG is formed as thin sheets, for example 5 mil, and bonded onto single solar cells much as conventional coverglass would be. A large sheet of PMG may be cast that can cover an entire solar panel. Alternately, the PMG coating may be applied via a spray process after the panel is fabricated. The sheet shown in FIG. 4 has a diffuse optical nature due to: 1) slight differences between the indices of refraction of the fused silica beads and the adhesive; and 2) the total internal reflection within the sheet due to the air interfaces at the front and back of the sheet.

A variety of coverglass adhesives from Dow-Corning and NuSil in combination with ceria-doped borosilicate and fused silica spheres were investigated (see FIG. 5). Efforts were made to maximize the bead loading in order to maximize the radiation stopping power per unit of PMG thickness. Due to the differing mechanical shape of the fused silica and borosilicate glass, the maximum bead content we were able to reproducibly form using the doctor blade technique was significantly different, 0.9:1 (bead to adhesive ratio by mass) for fused silica and 1.8:1 for borosilicate glass. We also investigated the effect of bead density on overall optical transmission. Those tests demonstrated that reducing the bead density by 50% only increased the overall transmission by ~1-2%. This result is understandable given that not all optical scattering events are necessarily harmful. A significant fraction of these are backscatter events, thus incident light that is reflected from a bead/adhesive interface has a significant probability of being reflected back toward the solar cell through another reflection event.

Figure 6:
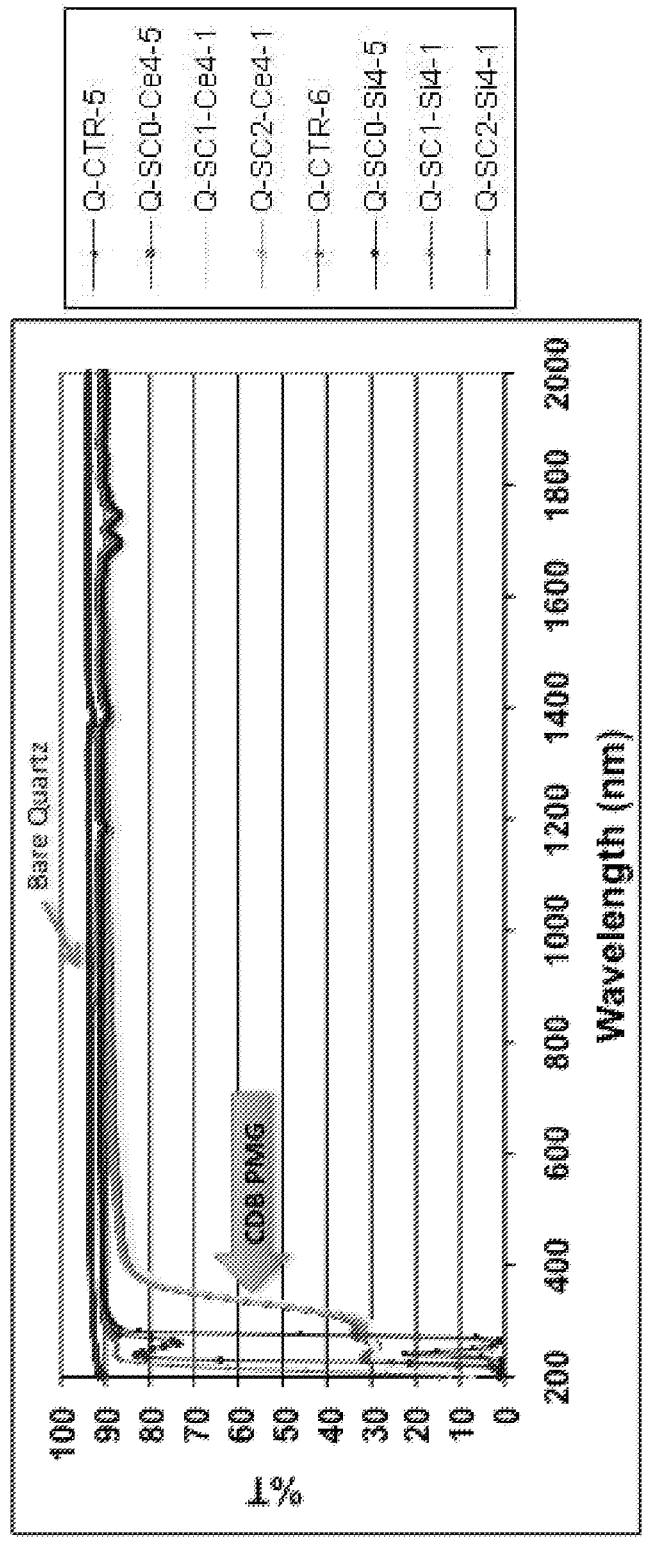
FIG. 6 is a plot of the transmission characteristics of 5-mil ceria-doped borosilicate PMG and Fused Silica PMG formed on quartz substrates with a variety of adhesives.

FIG. 6 shows PMG spectral transmission measurements for 5 mil PMG films on quartz slides formed using different adhesives and beads. The top line represents a bare quartz slide. The CDB marker highlights ceria doped borosilicate glass PMG films. It is apparent all of these films have a similar turn-on wavelength, which is controlled by the ceria doping in the beads. In addition, they generally have similar peak transmission characteristics, indicating that the optical index of refraction match is similar for all combinations. The other curves represent fused silica PMG films and as expected, the turn on wavelength is much shorter and controlled by the adhesive rather than the beads. Overall, these have similar spectral transmission characteristics, again indicating a relatively similar index match.

Figure 7:
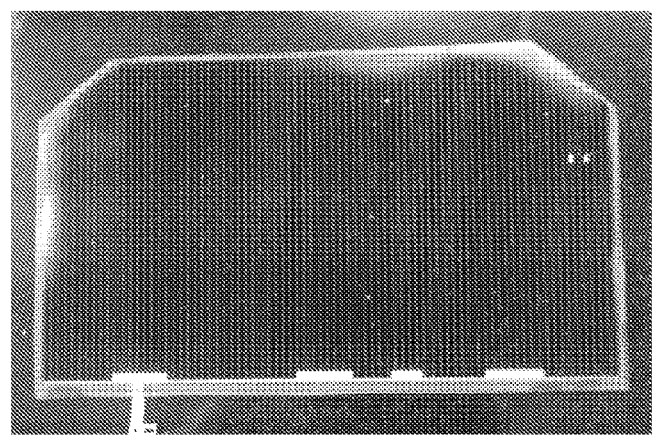
FIG. 7 is a photograph of a Spectrolab ITJ cell covered with fused silica PMG.

Samples of PMG were bonded to various solar cells to determine the impact of PMG transmission on overall performance. FIG. 7 is a photograph of a Spectrolab ITJ triple junction solar cell covered with a 5 mil fused silica PMG film. The PMG material appears opaque due to a significant amount of total internal reflection when free standing. This loss mechanism is largely eliminated once the film is bonded to a high index solar cell. Notice the clarity with which the grid fingers can be seen on the PMG coated solar cell in FIG. 7.

Figure 8A:
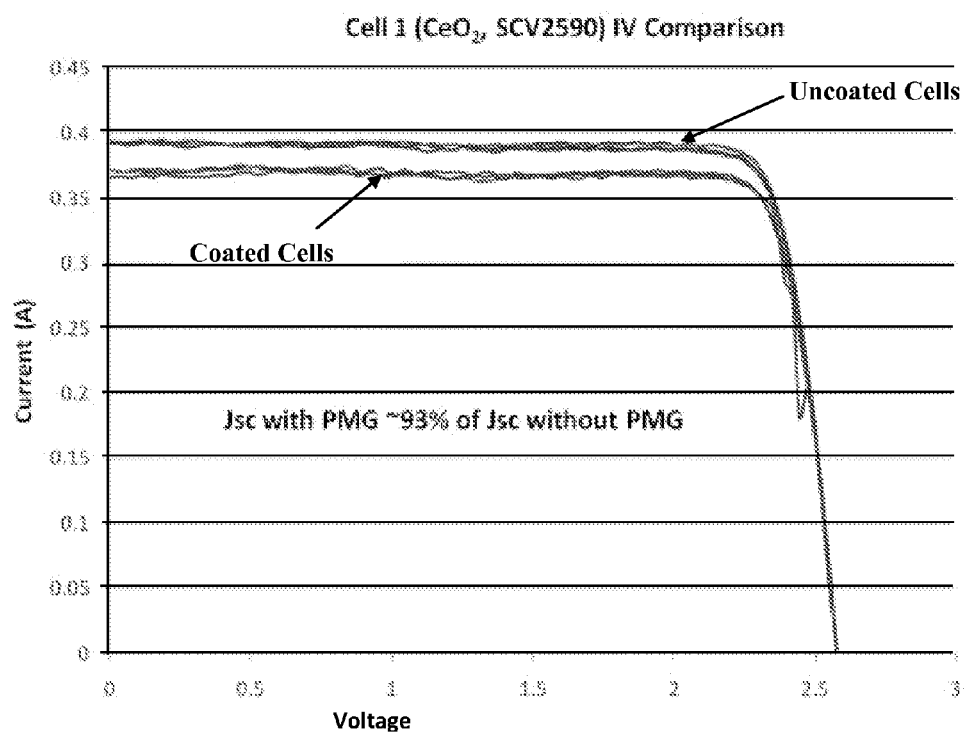
FIG. 8A shows current-voltage plots of various ITJ solar cells coated with ceria-doped borosilicate PMG compared to uncoated solar cells.

FIGS. 8A and 8B show the pre and post current-voltage (I-V) characteristics of ITJ cells with both types of PMG films. Given the relatively close transmission characteristics shown in FIG. 6, one would expect the performance to be comparable once bonded to a cell. Surprisingly, the ceria-doped borosilicate glass (FIG. 8A) demonstrated an approximate 7% decrease in short circuit current whereas the fused silica PMG-coated cell (FIG. 8B) showed essentially no loss. This test has been repeated for single junction devices and those results support these observations. In those tests, the fused silica PMG-coated GaAs cell actually showed a 1-2% increase in current, which is roughly comparable to the 3% increase noted for conventional coverglass coated cells.

Investigation into the environmental stability and protective nature of PMG was initiated. Of initial concern was the ability of the PMG film to withstand UV radiation. Bare samples of PMG adhesives were subjected to 1000 equivalent sun hours of external UV testing. FIG. 9 shows the percent change in spectral absorption for pure adhesive samples only. This testing demonstrated that DC93-500 (DC9) and SCV1-2590 (SCV1) were the most stable and were relatively equivalent.

Figure 10:
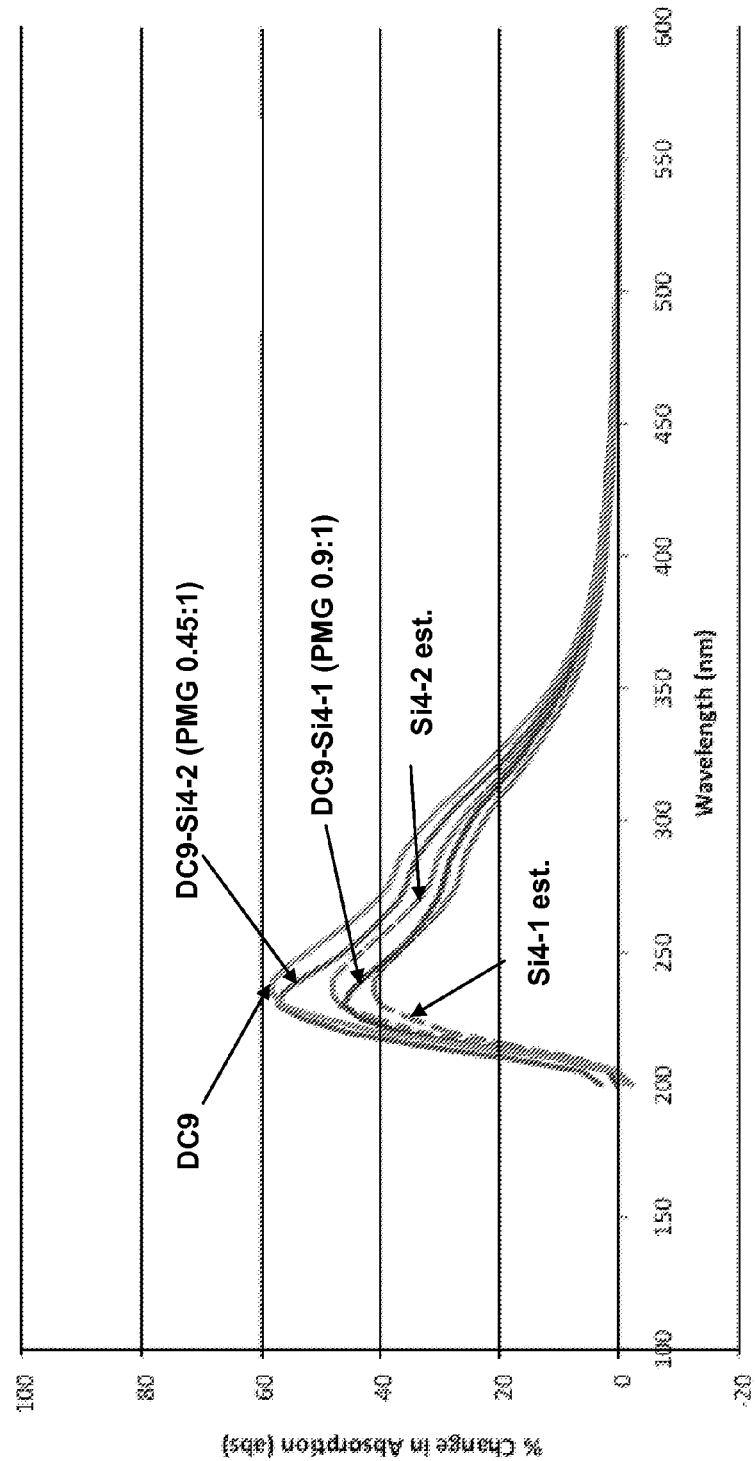
FIG. 10 plots the absolute change in fused silica PMG spectral absorption following 1000 sun equivalent hours of UV exposure.

PMG films tested under the same conditions (1000 sun equivalent hours) demonstrate the positive aspects of ceria doping of the bead material. FIG. 10 shows the percent change in absorption for bare adhesive as well as fused silica PMG films with two concentrations of beads (0.9:1 and 0.45:1). A calculation was made to estimate the PMG film performance based on the behavior of the adhesive assuming a simple volumetric displacement model, i.e., replacing UV sensitive adhesive with insensitive beads. The general agreement between the predicted behavior (dashed lines) and measured PMG materials (solid lines) suggests that inherent UV durability in fused silica PMG is limited by the amount of adhesive that can be replace with fused silica beads.

Figure 11:
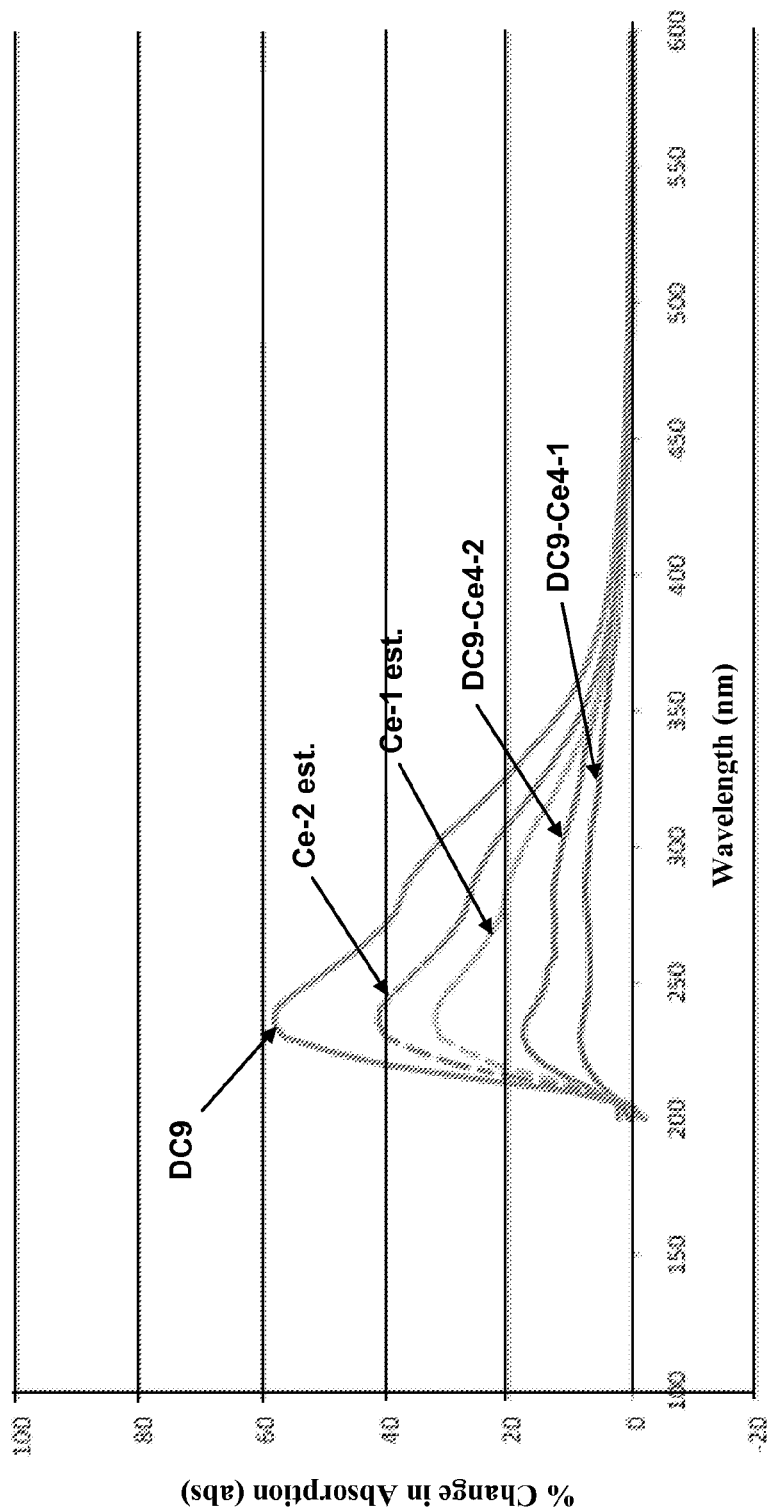
FIG. 11 plots the absolute change in ceria-doped borosilicate glass PMG spectral absorption following 1000 sun equivalent hours of UV exposure.

FIG. 11 demonstrates the same characterization assessment for ceria-doped borosilicate PMG. For this material, it is clear that the volumetric displacement model does not explain the enhancements in UV stability for this material. It appears that the uppermost ceria-doped borosilicate beads protect the underlying PMG adhesive from UV degradation because of their UV absorptive properties. This behavior is not unexpected and may be leveraged for future PMG versions, by forming a multi-layer PMG film with ceria-doped borosilicate glass beads at the surface in order to absorb the damaging UV light and fused silica PMG underneath to provide the wider spectral transmittance needed for the next generation of solar cells.

Initial testing of bare PMG as well as PMG coated solar cells subjected to electron and proton irradiation was undertaken. FIG. 12 shows the remaining factor for GaAs solar cells coated with ceria-doped borosilicate PMG (CDB PMG), fused silica PMG (FS PMG), conventional coverglass and a bare cell subjected to a $2\times10^{15}$/cm$^2$ 1-MeV electron fluence, where Voc is the open circuit voltage, Jsc is the short circuit current, and FF is the fill factor. Overall, the fused silica PMG compares well with conventional coverglass, with ceria-doped borosilicate PMG slightly lower in performance. A similar test was conducted on bare PMG samples subjected to a $1\times10^{15}$/cm$^2$ 1-MeV electron fluence. Optical characterization of the PMG samples showed no change in properties (no increase in absorption, reflection, etc), thus it is unclear as to why this ceria PMG sample showed lower performance. It is likely due to GaAs cell to cell variations as this data is for single samples.

A similar set of GaAs cells was subjected to 50 keV proton irradiation. At this energy, the protons are completely absorbed in the PMG/coverglass layer, thus one would expect that the underlying GaAs cell would not experience any damage. FIG. 13 shows the remaining factor for proton fluences of $4\times10^{14}$/cm$^2$ and $4\times10^{15}$/cm$^2$. As expected, the bare GaAs devices experienced significant damage (Jsc and Efficiency were completely degraded for $4\times10^{15}$/cm$^2$). The PMG films behaved like coverglass up to $4\times10^{14}$/cm$^2$ fluence. As the fluence increased, the PMG films demonstrated a slight amount of Jsc loss. Optical micrographs suggest that the loss in Jsc is likely due to an increase in reflectance. These reflectance losses appear to be coming from cracks in the PMG, likely caused by mechanical degradation of the PMG adhesive (adhesive material cross-linking).

PMG applied to a flexible blanket design solar panels offers coverglass heritage performance in a format that enables improved manufacturing, flexibility and performance. The PMG thickness can be tailored for the shielding requirements of the particular mission/orbit and not for ground handling yield issues. Conformal anti-reflection coatings and electrostatic discharge (ESD) coatings could be deposited on the entire coated blanket. The ability to conformally coat current rigid solar arrays for improved electrostatic discharge (ESD) protection is an additional benefit. Last year, 10% of new geostationary (GEO) spacecraft suffered electrical power system degradation/failures, with the vast majority of them being solar cell string losses.

New solar cell technologies require optical cover systems (coverglass, coatings, adhesives) that transmit photons from 300 nm to >1500 nm. Current coverglass chemistries are unable to meet this transmission bandwidth. The development of new coverglass technologies is being limited by the need to be able to form microsheets of the new material. The use of PMG eliminates this manufacturing limitation. The PMG material may offer improved off normal light capture characteristics compared to conventional planar coverglass technology. This is particularly of interest for solar arrays with less than 2-axis tracking and may represent an improvement in orbital energy capture.

The PMG approach allows the glass spheres to provide the bulk of radiation protection while keeping the volume of binder matrix material limited. Limited binder volume means reduced potential for optical degradation from environmental challenges. The PMG material can be applied to the array panel following cell laydown, potentially using a spray-on process for reduced costs and increased yields since many cells are rejected due to cracked coverglass.

Controlling the coefficient of thermal expansion (CTE) mismatch is and will continue to be an important issue for space solar arrays. The CTE of PMG materials can be altered by varying both the ratio of beads and adhesives as well as by altering the choice of bead and/or adhesive materials. Such an approach may reduce the difference in CTE mismatch between the PMG and the photovoltaic device.

The invention claimed is:

1. A multi-layer coverglass for a solar cell, comprising:
   a top layer comprised of ceria-doped borosilicate beads embedded in a top layer adhesive;
   a bottom layer comprised of fused silica beads embedded in a bottom layer adhesive;
   the top layer adhesive having a top layer adhesive mass and the bottom layer adhesive having a bottom layer adhesive mass;
   the ceria-doped borosilicate beads having a total ceria-doped borosilicate beads mass;
   the fused silica beads having a total fused silica beads mass;
   the top layer having a top layer mass ratio comprised of the total ceria-doped borosilicate beads mass to the top layer adhesive mass, and the top layer mass ratio having a maximum of 1.8:1; and
   the bottom layer having a bottom layer mass ratio comprised of the total fused silica beads mass to the bottom layer adhesive mass, and the bottom layer mass ratio having a maximum of 0.9:1; and
   the ceria-doped borosilicate beads and the fused silica beads having diameters ranging from 20 to 40 microns.

2. The multi-layer coverglass for a solar cell as defined in claim 1, wherein:
   the top layer and bottom layer are attached to each other to form a sheet; and
   the sheet covers an entire surface of an array of the solar cells.

3. The multi-layer coverglass for a solar cell as defined in claim 1, wherein the bottom layer has a thickness of 5 mil.

4. The multi-layer coverglass for a solar cell as defined in claim 3, wherein:
   the top layer and bottom layer are attached to each other to form a sheet; and
   the sheet covers an entire surface of art array of the solar cells.

5. A multi-layer coverglass for a solar cell, comprising:
   a top layer comprised of ceria-doped borosilicate beads embedded in a top layer adhesive;
   a bottom layer comprised of fused silica beads embedded in a bottom layer adhesive; and
   the ceria-doped borosilicate beads and the fused silica beads having diameters ranging from 20 to 40 microns.

6. The multi-layer coverglass for a solar cell as defined in claim 5, wherein the bottom layer has a thickness of 5 mil.

7. The multi-layer coverglass for a solar cell as defined in claim 6, wherein
   the top layer and bottom layer are attached to each other to form a sheet; and
   the sheet covers an entire surface of an array of the solar cells.

8. The multi-layer coverglass for a solar cell as defined in claim 5, wherein
   the top layer and bottom layer are attached to each other to form a sheet; and
   the sheet covers an entire surface of art array of the solar cells.

* * * * *